(12) United States Patent
Chen et al.

(10) Patent No.: US 11,157,048 B2
(45) Date of Patent: Oct. 26, 2021

(54) MEMORY MODULE WITH SCREEN AND MOTHERBOARD MODULE

(71) Applicant: GIGA-BYTE TECHNOLOGY CO., LTD., New Taipei (TW)

(72) Inventors: Hung-Cheng Chen, New Taipei (TW); Tse-Hsien Liao, New Taipei (TW); Chun-Chien Lee, New Taipei (TW); Chen-Te Hsu, New Taipei (TW)

(73) Assignee: GAGA-BYTE TECHNOLOGY CO., LTD., New Taipei (TW)

( * ) Notice: Subject to any disclaimer, the term of this patent is extended or adjusted under 35 U.S.C. 154(b) by 55 days.

(21) Appl. No.: 16/558,343

(22) Filed: Sep. 3, 2019

(65) Prior Publication Data
US 2020/0174532 A1 Jun. 4, 2020

(30) Foreign Application Priority Data
Dec. 3, 2018 (TW) .................................. 107143174

(51) Int. Cl.
*G06F 1/18* (2006.01)
*G06F 1/20* (2006.01)
(Continued)

(52) U.S. Cl.
CPC .............. *G06F 1/185* (2013.01); *G06F 1/186* (2013.01); *G06F 1/20* (2013.01); *H05K 1/0203* (2013.01);
(Continued)

(58) Field of Classification Search
CPC ............ G06F 1/185; G06F 1/186; G06F 1/20; H05K 1/0203; H05K 2201/10128; H05K 2201/10136
See application file for complete search history.

(56) References Cited

U.S. PATENT DOCUMENTS 7,131,767 B2 11/2006 Socci et al.
9,723,697 B1 * 8/2017 Cheng .................... H05B 45/20
(Continued)

FOREIGN PATENT DOCUMENTS

CN 101894057 11/2010
CN 102270164 12/2011
(Continued)

OTHER PUBLICATIONS

"Search Report of Europe Counterpart Application", dated Apr. 9, 2020, p. 1-p. 11.
(Continued)

*Primary Examiner* — Nidhi Thaker
(74) *Attorney, Agent, or Firm* — JCIPRNET

(57) ABSTRACT

A memory module with a screen includes a memory substrate, a power conversion module, a screen control module, and a screen. The memory substrate includes a plurality of memory components and a connection interface. The power conversion module is disposed on the memory substrate and electrically connected to the connection interface. The screen control module is disposed on the memory substrate and electrically connected to the connection interface and the power conversion module. The screen is disposed on the memory substrate, and the screen is electrically connected to the power conversion module and the screen control module to receive a voltage output from the power conversion module and a display signal output from the screen control module. A motherboard module including a memory module with a screen is also provided.

9 Claims, 7 Drawing Sheets

(51) Int. Cl.
*H05K 5/00* (2006.01)
*H05K 1/02* (2006.01)
*H01R 12/73* (2011.01)
*G06F 3/14* (2006.01)
*H05K 1/14* (2006.01)

(52) U.S. Cl.
CPC .......... *G06F 3/1446* (2013.01); *H01R 12/737* (2013.01); *H05K 1/141* (2013.01); *H05K 5/0017* (2013.01); *H05K 2201/10128* (2013.01); *H05K 2201/10136* (2013.01); *H05K 2201/10159* (2013.01); *H05K 2201/10356* (2013.01)

(56) References Cited

U.S. PATENT DOCUMENTS

| | | | | |
|---|---|---|---|---|
| 9,769,893 | B1* | 9/2017 | Wu | H05B 47/165 |
| 9,817,168 | B2* | 11/2017 | Kuo | G02B 6/0001 |
| 9,820,366 | B2* | 11/2017 | Kuo | G06F 1/1616 |
| 9,839,121 | B2* | 12/2017 | Cheng | H05K 3/284 |
| 10,288,791 | B2* | 5/2019 | Tseng | G02B 6/0036 |
| 10,429,568 | B2* | 10/2019 | Cheng | G11C 5/04 |
| 2006/0045168 | A1 | 3/2006 | Socci et al. | |
| 2010/0315436 | A1 | 12/2010 | Chan | |
| 2016/0212824 | A1* | 7/2016 | Kuo | G06F 3/06 |
| 2017/0315768 | A1* | 11/2017 | Cheng | G09G 3/14 |
| 2017/0339465 | A1 | 11/2017 | Cannistraro et al. | |

FOREIGN PATENT DOCUMENTS

| | | |
|---|---|---|
| CN | 202331310 | 7/2012 |
| CN | 103793303 | 5/2014 |
| CN | 205230594 | 5/2016 |
| JP | S63122867 | 8/1988 |
| JP | H08115399 | 5/1996 |
| JP | 2000278572 | 10/2000 |
| TW | 200825673 | 6/2008 |
| TW | 201044262 | 12/2010 |
| TW | 201344428 | 11/2013 |
| TW | 201520737 | 6/2015 |
| TW | I492049 | 7/2015 |

OTHER PUBLICATIONS

"Office Action of Taiwan Counterpart Application," dated Nov. 26, 2019, p. 1-p. 10.
"Office Action of China Counterpart Application", dated Jan. 5, 2021, p. 1-p. 7.
"Office Action of Japan Counterpart Application", dated Nov. 24, 2020, p. 1-p. 3.
"Summons to attend oral proceedings of Europe Counterpart Application", dated Jul. 29, 2021, pp. 1-14.

* cited by examiner

MEMORY MODULE WITH SCREEN AND MOTHERBOARD MODULE

CROSS-REFERENCE TO RELATED APPLICATION

This application claims the priority benefit of Taiwan application Ser. No. 107143174, filed on Dec. 3, 2018. The entirety of the above-mentioned patent application is hereby incorporated by reference herein and made a part of this specification.

BACKGROUND OF THE INVENTION

Field of the Invention

The invention relates to a memory module and a motherboard module, and in particular, to a memory module with a screen and a motherboard module.

Description of Related Art

In recent years, with the rapid development and advancement of technology, desktop computers have become quite common. At present, in order to provide users with more visual effects, some motherboards are provided with light-emitting components (such as LEDs), and additional slots are provided to insert the light-emitting components into the slots, so that the light-emitting components directly receive the voltage output from the motherboard.

However, in addition to achieving the effect of light conversion, the light-emitting components may not provide more functions for the user.

SUMMARY OF THE INVENTION

The invention provides a memory module with a screen, which does not occupy a power supply slot on the motherboard, and may display text messages and images.

The invention provides a motherboard module including the memory module with the screen.

A memory module with a screen of the invention includes a memory substrate, a power conversion module, a screen control module, and a screen. The memory substrate includes a plurality of memory components and a connection interface. The power conversion module is disposed on the memory substrate and electrically connected to the connection interface. The screen control module is disposed on the memory substrate and electrically connected to the connection interface and the power conversion module. The screen is disposed on the memory substrate, and the screen is electrically connected to the power conversion module and the screen control module to receive a voltage output from the power conversion module and a display signal output from the screen control module.

In an embodiment of the invention, the power conversion module and the screen control module are electrically connected to a plurality of empty pins of the connection interface of the memory substrate.

In an embodiment of the invention, the memory substrate further includes a standard height region and an expansion region, the expansion region is disposed beside the standard height region and away from the connection interface, the plurality of memory components are disposed in the standard height region, and the power conversion module and the screen control module are disposed on the expansion region.

In an embodiment of the invention, a heat dissipation cover is further disposed on the memory substrate and thermally coupled to the plurality of memory components. The heat dissipation cover has a surface, the screen is disposed on the surface, and the screen is thermally coupled to the surface.

In an embodiment of the invention, a flexible cable is further respectively connected to the screen and the memory substrate, and the screen is electrically connected to the power conversion module and the screen control module via the flexible cable.

The motherboard module of the invention includes a motherboard, a memory module with a screen, a power conversion module, and a screen control module. The motherboard includes a memory slot. The memory module with the screen is detachably inserted into the memory slots. The memory module with the screen includes a memory substrate and a screen. The memory substrate includes a plurality of memory components and a connection interface, and the connection interface is detachably inserted into the corresponding memory slot. The screen is disposed on the memory substrate. The power conversion module is disposed on the memory substrate and electrically connected to the connection interface, or disposed on the motherboard and electrically connected to the memory slot. The screen control module is disposed on the memory substrate and electrically connected to the connection interface and the power conversion module, or is disposed on the motherboard and electrically connected to the memory slot and the power conversion module. In particular, when the memory module with the screen is inserted into the memory slot, the screen is electrically connected to the power conversion module and the screen control module to receive a voltage output by the power conversion module and a display signal output by the screen control module.

In an embodiment of the invention, the power conversion module and the screen control module are electrically connected to a plurality of empty pins of the connection interface of the memory substrate.

In an embodiment of the invention, the memory substrate is provided with the power conversion module and the screen control module, and the memory substrate further includes a standard height region and an expansion region, and the expansion region is disposed beside the standard height region and away from the connection interface, and in each memory substrate, the plurality of memory components are disposed in the standard height region, and the power conversion module and the screen control module are disposed on the expansion region.

In an embodiment of the invention, the memory module with the screen further includes a heat dissipation cover disposed on the memory substrate and thermally coupled to the plurality of memory components, the heat dissipation cover includes a surface, and the screen is disposed on the surface and thermally coupled to the heat dissipation cover.

In an embodiment of the invention, the memory module with the screen further includes a flexible cable fixed to the memory substrate, and the screen is electrically connected to the power conversion module and the screen control module via the flexible cable.

In an embodiment of the invention, the memory module with the screen includes the memory modules with the screen, and when the memory modules with the screen are inserted into the memory slots, the screens of the memory modules with the screen are spliced together into a combined screen.

Based on the above, the screen of the memory module with the screen of the invention is electrically connected to the power conversion module and the screen control module, and the power conversion module and the screen control module are electrically connected to the connection interface. When the memory module with the screen is inserted into the memory slot, the power conversion module and the screen control module receive a signal from the motherboard via the memory slots. The power conversion module converts the voltage from the memory slots into the voltage required by the screen, and the screen control module processes the signal from the memory slots to control the screen displayed by the screen. Therefore, since the screen of the memory module with the screen of the invention shares the memory slots on the motherboard with the memory substrate, the motherboard does not need to have an additional slot for power supply and signal, thereby saving space on the motherboard. In addition, the screen of the memory module with the screen of the invention may display text messages and images to provide users with more information and visual effects. In addition, in an embodiment, the power conversion module and the screen control module may also be optionally disposed on the motherboard and electrically connected to the memory slot, so that the screen of the memory module with the screen may still obtain the required voltage and control signal via the memory slots.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
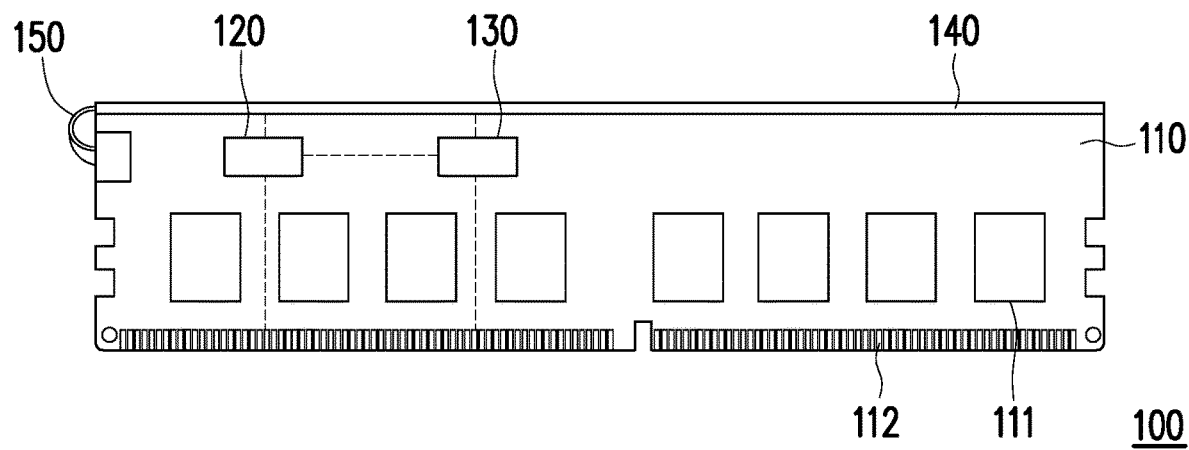
FIG. 1A is a front view of a memory module with a screen in accordance with an embodiment of the invention.
Figure 1B:
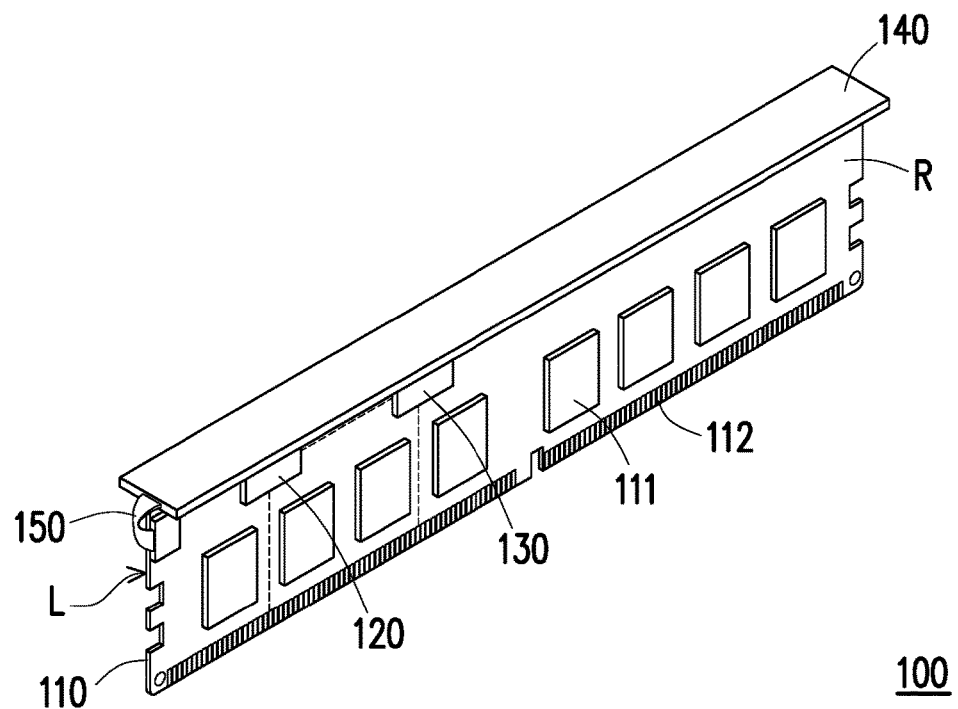
FIG. 1B is a perspective view of the memory module with the screen of FIG. 1A.

FIG. 1A is a schematic view of a memory module with a screen in accordance with an embodiment of the invention.
FIG. 1B is a perspective view of the memory module with the screen of FIG. 1A. Referring to FIG. 1A to FIG. 1B, a memory module 100 with a screen includes a memory substrate 110, a power conversion module 120, a screen control module 130, and a screen 140. The memory substrate 110 includes a plurality of memory components 111 and a connection interface 112. Here, the connection interface 112 is, for example, a connection interface of a gold finger structure, but is not limited thereto.

In the present embodiment, the power conversion module 120 is disposed on the memory substrate 110 and electrically connected (shown in broken lines) to the connection interface 112. The screen control module 130 is disposed on the memory substrate 110 and electrically connected to the connection interface 112 and the power conversion module 120. The screen 140 is disposed on the memory substrate 110, and the screen 140 is electrically connected to the power conversion module 120 and the screen control module 130 to receive a voltage output from the power conversion module 120 and a display signal output from the screen control module 130.

Referring to FIG. 1B, in the present embodiment, the power conversion module 120 and the screen control module 130 are disposed on a lateral surface R of the memory substrate 110 the same as the memory components 111, but is not limited thereto. As long as the components on the memory substrate 110 do not interfere with each other, the power conversion module 120 and the screen control module 130 may also be disposed on another lateral surface L of the memory substrate 110, or the power conversion module 120 and the screen control module 130 may be disposed separately on the two lateral surfaces R and L on the memory substrate 110.

In detail, the power conversion module 120 includes an integrated circuit, a passive component, a boosting circuit, a step-down circuit, or a combination thereof (not shown). The power conversion module 120 converts the initial voltage from the connection interface 112 into a converted voltage. The converted voltage is provided to the screen 140 and the screen control module 130, wherein the initial voltage is, for example, a voltage such as 0.6 volts, 1.2 volts, or 2.5 volts, and the converted voltage is, for example, 3.3 volts or the total voltage of the screen 140 plus other integrated circuits.

The reason why the memory module 100 with the screen is provided with the power conversion module 120 is that the initial voltage from the connection interface 112 may only be used by the memory substrate 110 and cannot be directly provided to the screen 140 for use. In general, if an external screen is to be powered, an additional slot needs to be provided to provide a suitable voltage to the external screen, and the motherboard used in the memory module 100 with the screen of the present embodiment does not need to be additionally provided with an electrical slot exclusive for the screen 140. The memory module 100 with the screen of the present embodiment may directly convert the initial voltage into an appropriate voltage via the power conversion module 120 for use by the screen 140 and the screen control module 130 to save space on the motherboard.

In the present embodiment, the screen control module 130 includes an integrated circuit, a passive component, a boosting circuit, a step-down circuit, or a combination thereof (not shown). The screen control module 130 receives the voltage provided by the power conversion module 120 and is electrically connected to the serial data (SDA) and the serial clock (SCL) of the connection interface 112 to obtain a signal from the motherboard. The motherboard may operate the display signal provided to the screen 140 by the screen control module 130 via a software or an application, for example, via a software or an application to switch display information, display graphics, etc., to provide users with more functionality and entertainment.

It is worth mentioning that, in general, the pins on the connection interface 112 of the gold finger structure of the memory substrate 110 leave empty pins (that is, undefined pin positions). In the present embodiment, the power conversion module 120 and the screen control module 130 are electrically connected to the memory slots on the motherboard via the empty pins of the connection interface 112 of the gold finger structure. Here, the empty pins are, for example, the pin position number 47, 49, 54, 56, 93, 192, 194, 196, 197, 199, 201, 230, 234, 235, or 237 located on the connection interface 112 of the gold finger structure. In this way, the memory substrate 110 of the memory module 100 with the screen may still transmit the memory signal along the original pin position, and the signal transmission of the power conversion module 120 and the screen control module 130 does not affect the transmission of the original memory signal.

In addition, in the present embodiment, the memory module 100 with the screen adopts a memory substrate 110 of a general industrial grade, and the height thereof is, for example, between 1.1 inches and 1.2 inches, and the memory components 111 are disposed on the memory substrate 110 that is closer to the connection interface 112 than the power conversion module 120 and the screen control module 130. That is, the plurality of memory components 111 are moved down to a position close to the connection interface 112, and the power conversion module 120 and the screen control module 130 are disposed above the plurality of memory components 111 and near the screen 140. Of course, the configuration of the memory components 111, the power conversion module 120, and the screen control module 130 is not limited thereto, and as long as the components on the memory substrate 110 do not interfere with each other, the configuration of the memory components 111, the power conversion module 120, and the screen control module 130 may be adjusted as required by the process.

In addition, the memory module 100 with the screen further includes a flexible cable 150, and the flexible cable 150 is fixed to the memory substrate 110, and the manner of fixing is, for example, snapping, inlaying, or bonding, and is not limited thereto. The flexible cable 150 is electrically connected to the screen 140 and the memory substrate 110 via the wires inside that are not exposed, and the screen 140 may be electrically connected to the power conversion module 120 and the screen control module 130 via the flexible cable 150. In other embodiments, the screen 140 may also be directly electrically connected to the power conversion module 120 and the screen control module 130 without the flexible cable 150. The method of electrical connection of the screen 140 to the power conversion module 120 and the screen control module 130 is not limited thereto.

Figure 2:
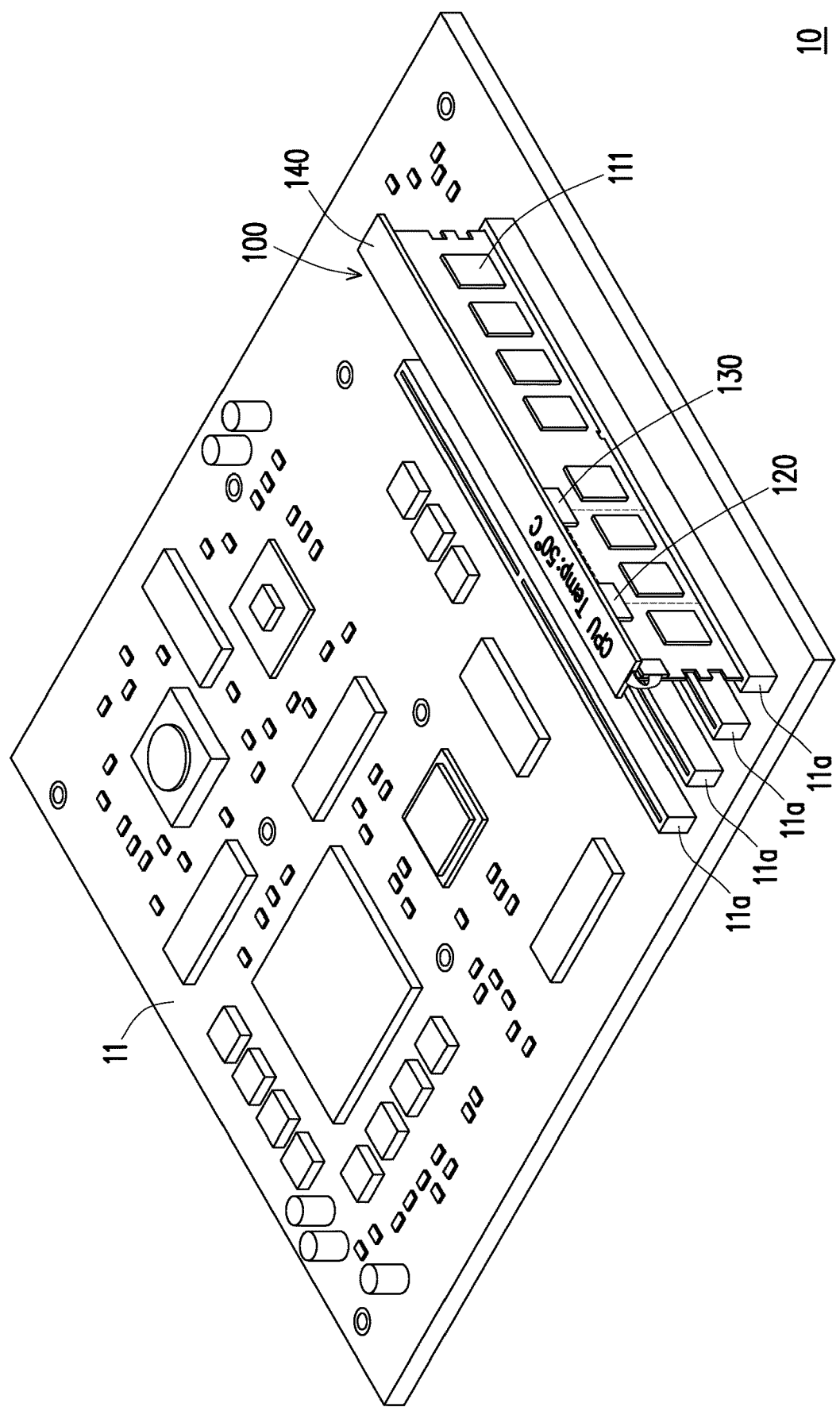
FIG. 2 is a schematic view of the memory module with the screen of FIG. 1A inserted into a motherboard.

FIG. 2 is a schematic view of the memory module with the screen of FIG. 1A inserted into a motherboard. Referring to FIG. 2, the motherboard module 10 includes the motherboard 11 and the memory module 100 with the screen. The motherboard 11 includes memory slots 11a. The connection interface 112 of the memory module 100 with the screen is detachably inserted into the memory slot 11a. It should be noted that only four memory slots 11a are schematically illustrated in FIG. 2. In actuality, the number of the memory slots 11a may also be two or eight, and is not limited thereto.

In the present embodiment, when the memory module 100 with the screen is inserted into the memory slot 11a, the power conversion module 120 and the screen control module 130 receive a signal from the motherboard 11 via the memory slot 11a. The power conversion module 120 converts the voltage from the memory slot 11a into the voltage required by the screen 140, and the screen control module 130 processes the signal from the memory slot 11a to control the picture displayed by the screen 140. Therefore, the screen 140 may display text messages or images, such as text messages or images such as the operating frequency or operating temperature of a central processing unit (CPU) to provide users with more functionality.

Figure 3:
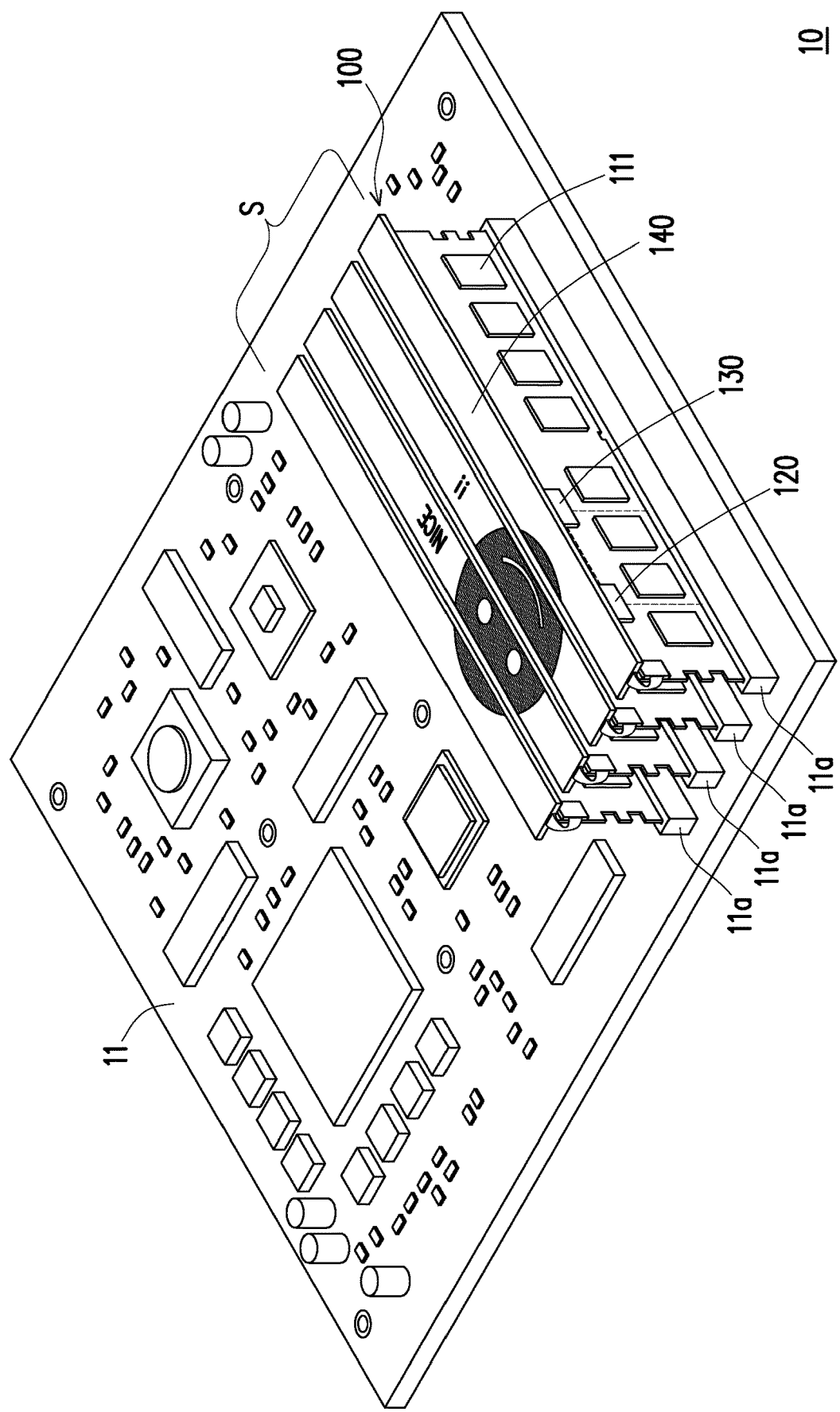
FIG. 3 is a schematic view of a plurality of the memory module with the screen of FIG. 1A inserted into a motherboard.

FIG. 3 is a schematic view of a plurality of the memory module with the screen of FIG. 1A inserted into a motherboard. Referring to FIG. 3, when a plurality of (for example, four) memory modules 100 with the screen are inserted into the memory slots 11a, the four screens 140 of the four memory modules 100 with the screen are combined into a combined screen S, and the combined screen S may display a large area of text messages or images.

Other embodiments are listed below for illustration. It should be mentioned that, the embodiments below use the same device labels and portions of the content from previous embodiments. Specifically, the same labels are used to represent the same or similar devices, and the descriptions for the same techniques are omitted. The omitted portions are as described in the embodiments above and are not repeated in the embodiments below.

Figure 4:
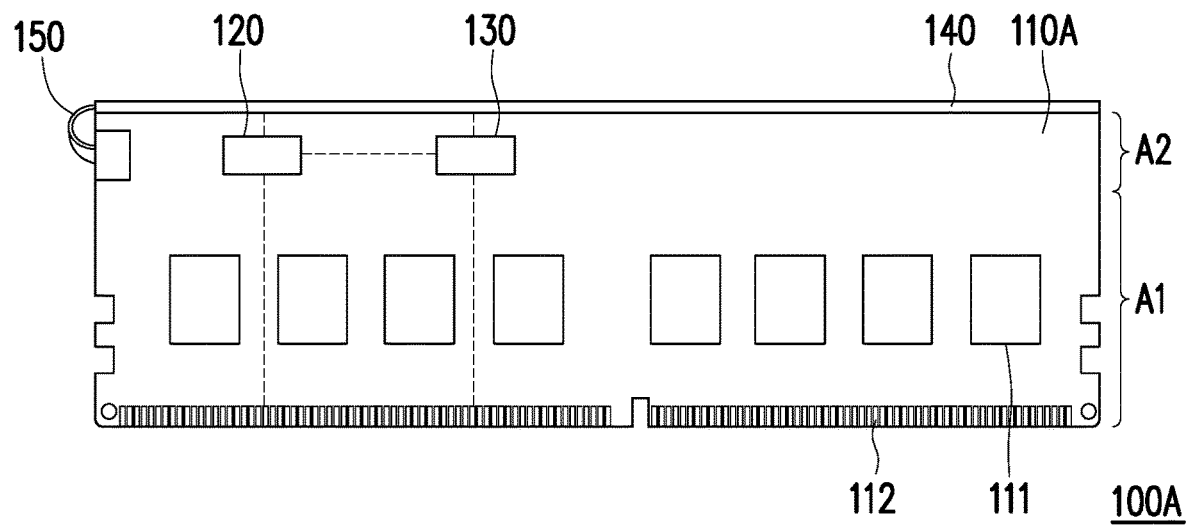
FIG. 4 is a front view of a memory module with a screen in accordance with another embodiment of the invention.

FIG. 4 is a front view of a memory module with a screen in accordance with another embodiment of the invention. Referring to FIG. 4, FIG. 4 is slightly different from the memory module with the screen of FIG. 1A to FIG. 1B. The difference is the height of the memory substrate. In the present embodiment, a memory substrate 110A is the memory substrate 110 heightened. Such a memory module 100A with the screen has a greater area, so that the components on the memory substrate 110A may be disposed on the memory substrate 110A with less space limit.

In detail, the memory substrate 110A further includes a standard height region A1 and an expansion region A2. The expansion region A2 is disposed beside the standard height region A1 and away from the connection interface 112. The sum of the heights of the standard height region A1 and the extension region A2 is greater than 1.2 inches. The memory components 111 are disposed in the standard height region A1, and the power conversion module 120 and the screen control module 130 are disposed on the expansion region A2. Of course, the configuration of the memory components 111, the power conversion module 120, and the screen control module 130 is not limited thereto, and any configuration in which the components on the memory substrate 110A do not interfere with each other is within the scope of the invention.

Figure 5A:
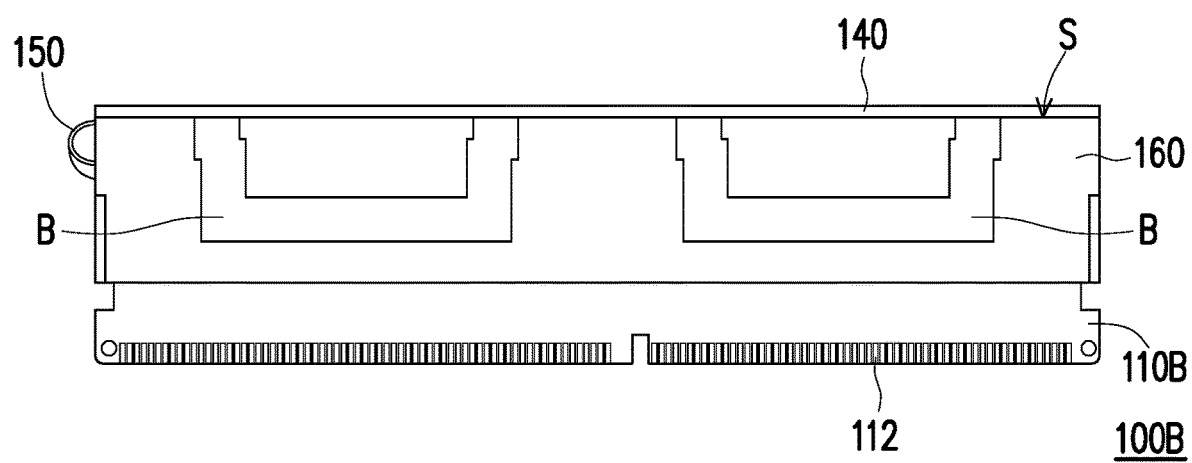
FIG. 5A is a front view of a memory module with a screen in accordance with another embodiment of the invention.
Figure 5B:
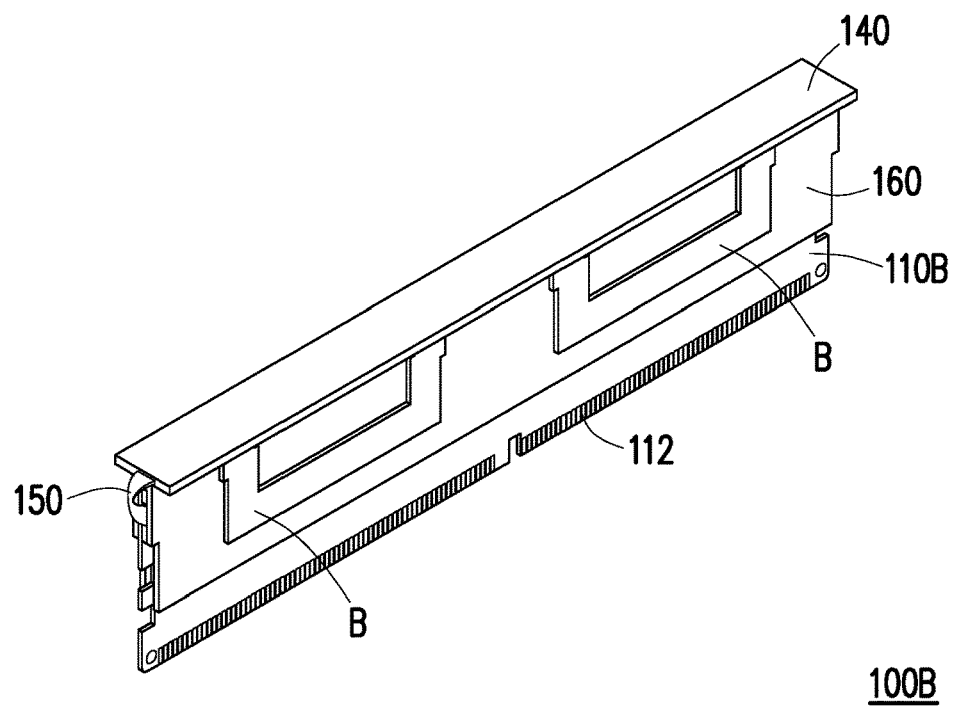
FIG. 5B is a perspective view of the memory module with the screen of FIG. 5A.

FIG. 5A is a front view of a memory module with a screen in accordance with another embodiment of the invention. FIG. 5B is a perspective view of the memory module with the screen of FIG. 5A. Referring to FIG. 5A and FIG. 5B, a memory module 100B with a screen further includes a heat dissipation cover 160 compared to the memory modules 100 and 100A with the screen. In the present embodiment, in the memory module 100B with the screen, the heat dissipation cover 160 is clamped on the memory substrate 110B via a clip B, but is not limited thereto. In other embodiments, the memory module 100B with the screen may not need the clip B, and instead the heat dissipation cover 160 may be fixed on the memory substrate 110B using a bonding method. The heat dissipation cover 160 is disposed on the memory substrate 110B and thermally coupled to the memory components 111. It should be noted that the memory components 111 are covered by the heat dissipation cover 160, so that the memory components cannot be seen in FIG. 5A and FIG. 5B.

As shown in FIG. 5A, the heat dissipation cover 160 has a surface S, the screen 140 is disposed on the surface S, and the screen 140 is thermally coupled to the surface S. That is to say, the heat dissipation cover 160 has a function of simultaneously helping the memory components 111 and the screen 140 to dissipate heat. In the present embodiment, the surface S is, for example, the top surface of the heat dissipation cover 160, but is not limited thereto. In other embodiments, the surface S may also be the side surface of the heat dissipation cover 160.

Figure 6:
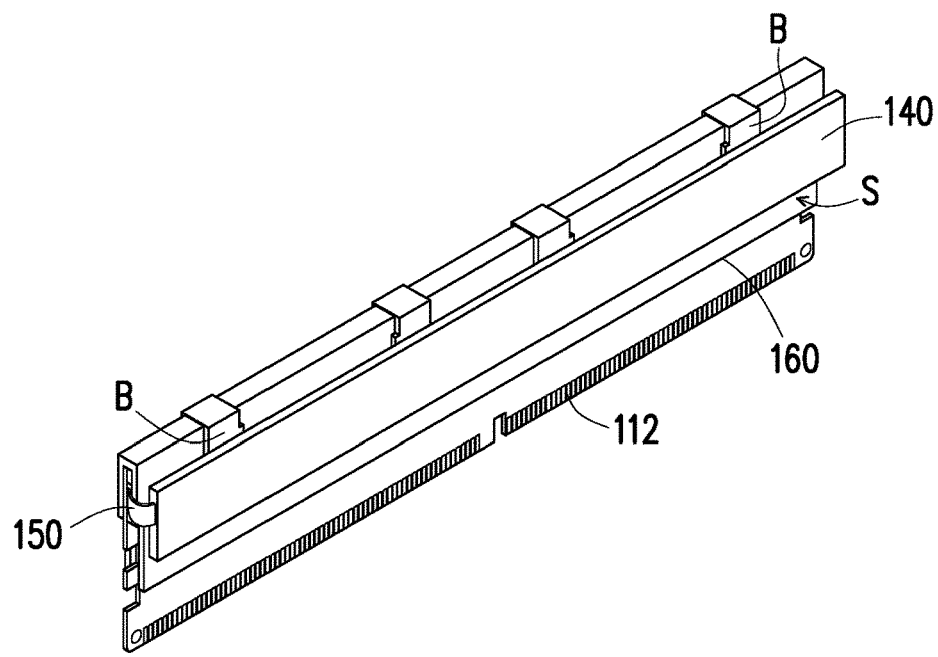
FIG. 6 is a perspective view of a memory module with a screen in accordance with another embodiment of the invention.

FIG. 6 is a perspective view of a memory module with a screen according to another embodiment of the invention. Referring to FIG. 6, in the present embodiment, the surface S is a side surface of the heat dissipation cover 160, and the screen 140 is disposed on the surface S of the heat dissipation cover 160.

It should be noted that the memory modules with the screen in FIGS. 5A and 5B or FIG. 6 may also include the flexible cable 150. In the present embodiment, the flexible cable 150 may also be fixed on the heat dissipation cover 160. The fixing method is, for example, engaging, inlaying, or bonding, but is not limited thereto, and any method in which the flexible cable 150 may be fixed to the memory substrate is within the scope of the invention.

Figure 7:
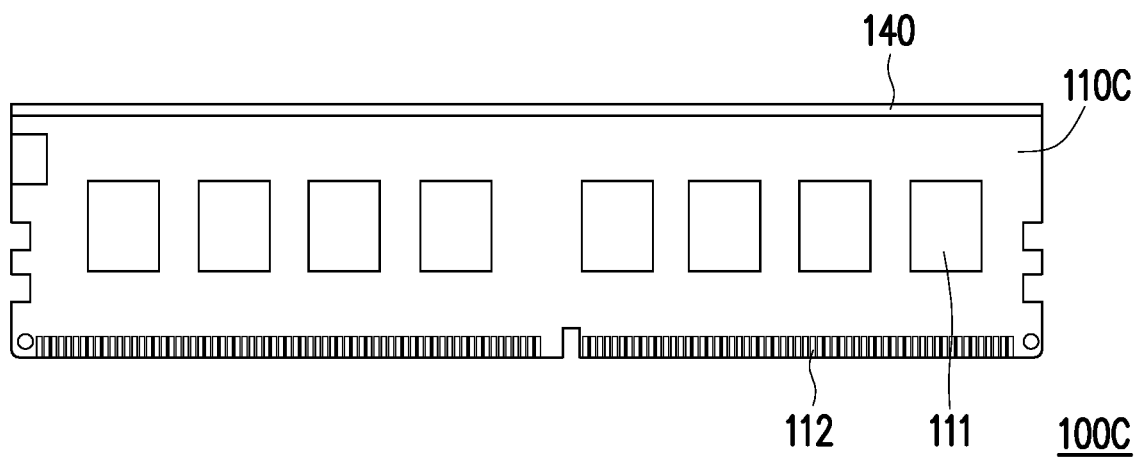
FIG. 7 is a front view of a memory module with a screen in accordance with another embodiment of the invention.
Figure 8:
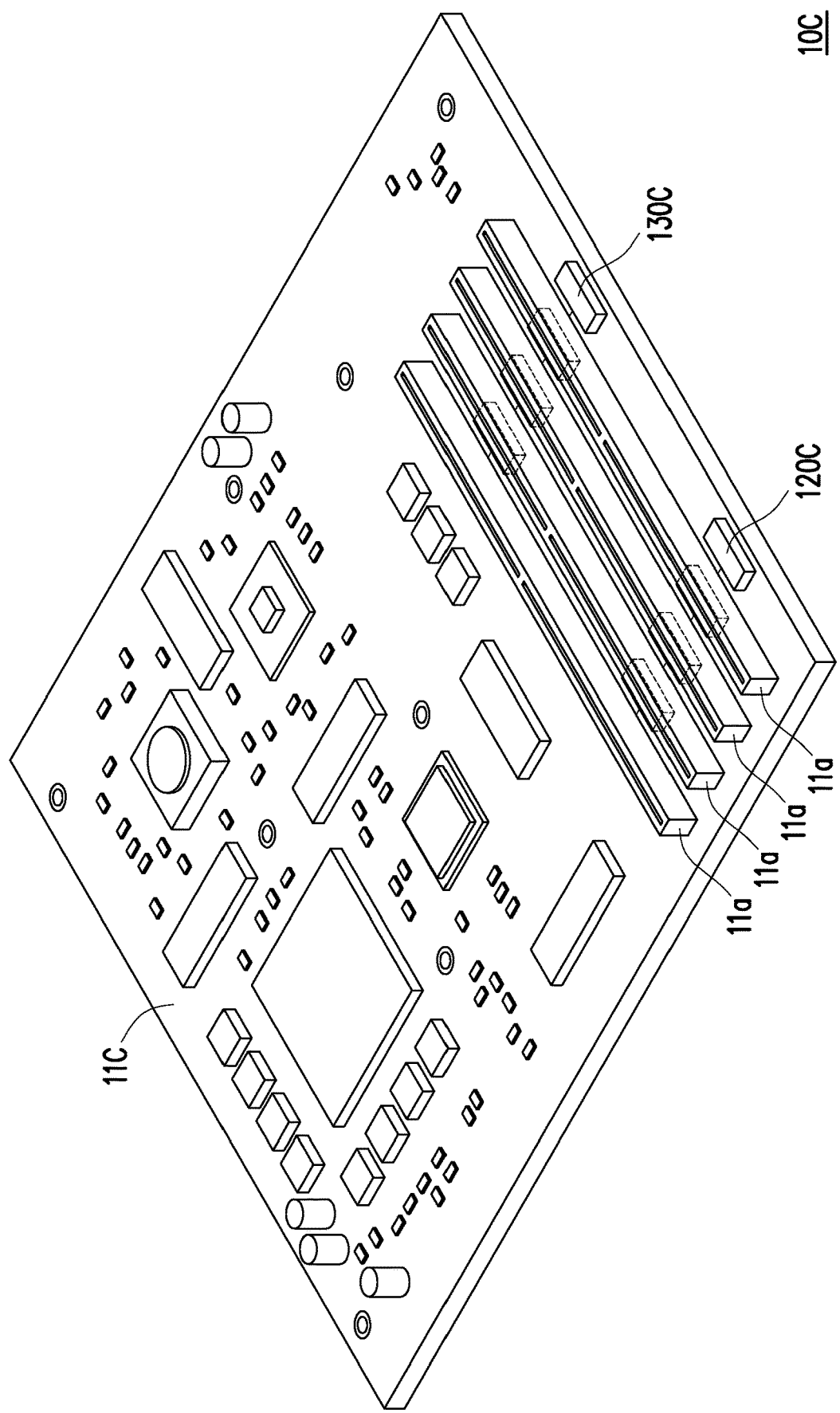
FIG. 8 is the schematic diagram of a motherboard module in accordance with another embodiment of the invention.

FIG. 7 is a front view of a memory module with a screen in accordance with another embodiment of the invention. FIG. 8 is a schematic diagram of a motherboard module in accordance with another embodiment of the invention. Referring to FIG. 7 and FIG. 8, the main difference between a motherboard module 10C and the motherboard module 10 is that a power conversion module 120C and a screen control module 130C are both disposed on a motherboard 11C.

In the present embodiment, the memory module 100C with the screen may be inserted into one of the memory slots 11a. The power conversion module 120C is disposed on the motherboard 11C and electrically connected to the memory slots 11a. The screen control module 130C is disposed on the motherboard 11C and electrically connected to the memory slots 11a and the power conversion module 120C.

In the present embodiment, the power conversion module 120C converts the initial voltage from the circuit of the motherboard 11C into the converted voltage required by the screen 140, and the converted voltage passes through one of the empty pins on the connection interface 112 to supply power to the screen 140. That is to say, in the present embodiment, the voltage passing through the empty pin is the voltage required by the screen 140. In the present embodiment, compared to the configuration in which the power conversion module 120C and the screen control module 130C are disposed on the memory substrate 110C in the motherboard module 10, the advantage of the present embodiment is that the memory manufacturer does not need to significantly change the design of the memory substrate 110C, and the screen 140 only needs to be disposed on the memory substrate 110C.

FIG. 8 only schematically shows four memory slots 11a, four power conversion modules 120C and four screen control modules 130C, and in actuality, the number of the memory slots 11a may also be two or eight and is not limited thereto. The number of the power conversion module 120C and the screen control modules 130C is configured according to the corresponding number of the memory module 100C with the screen.

When a plurality of (for example, four) memory modules 100 with the screen are inserted into the memory slots 11a, the four screens 140 of the four memory modules 100 with the screen are combined into the combined screen S of FIG. 3, and the combined screen S may display text messages or images.

Based on the above, the screen of the memory module with the screen of the invention is electrically connected to the power conversion module and the screen control module, and the power conversion module and the screen control module are electrically connected to the connection interface. When the memory module with the screen is inserted into the memory slot, the power conversion module and the screen control module receive a signal from the motherboard via the memory slot. The power conversion module converts the voltage from the memory slot into the voltage required by the screen, and the screen control module processes the signal from the memory slot to control the image displayed by the screen. Therefore, since the screen of the memory module with the screen of the invention shares the memory slots on the motherboard with the memory substrate, the motherboard does not need to have an additional slot for power supply and signal, thereby saving space on the motherboard. In addition, the screen of the memory module with the screen of the invention may display text messages and images to provide users with more information and visual effects. In addition, in an embodiment, the power conversion module and the screen control module may also be selectively disposed on the motherboard and electrically connected to the memory slots, so that the screen of the memory module with the screen may still obtain the required voltage and control signal via the memory slots. In addition, the user may operate the screen control module via a software or an application to provide users with a more diverse functionality. In this way, the memory module with the screen may provide more information and entertainment to the user without increasing the burden of motherboard space configuration.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory module with a screen, comprising:
    a memory substrate comprising a plurality of memory components and a connection interface;
    a power conversion module disposed on the memory substrate and electrically connected to the connection interface;
    a screen control module disposed on the memory substrate and electrically connected to the connection interface and the power conversion module;
    a screen disposed on the memory substrate, wherein the screen is electrically connected to the power conversion module and the screen control module to receive a voltage output from the power conversion module and a display signal output from the screen control module; and
    a heat dissipation cover disposed on the memory substrate and thermally coupled to the memory components, wherein the heat dissipation cover has a top surface, the screen is disposed on the top surface of the heat dissipation cover such that the screen is not covered by the heat dissipation cover, the screen is totally exposed, and the screen is thermally coupled to the top surface, the screen is used to display text messages and images, the connection interface comprises serial data and serial clock, and the screen control module is electrically connected to the serial data and serial clock of the connection interface.

2. The memory module with the screen of claim 1, wherein the power conversion module and the screen control module are electrically connected to a plurality of empty pins of the connection interface of the memory substrate.

3. The memory module with the screen of claim 1, wherein the memory substrate further comprises a standard height region and an expansion region, the expansion region is disposed adjacent to the standard height region and away from the connection interface, the memory components are disposed in the standard height region, and the power conversion module and the screen control module are disposed on the expansion region.

4. The memory module with the screen of claim 1, further comprising:
a flexible cable respectively connected to the screen and the memory substrate, wherein the screen is electrically connected to the power conversion module and the screen control module via the flexible cable.

5. A motherboard module, comprising:
a motherboard comprising a plurality of memory slots;
at least one memory module with a screen detachably inserted into at least one of the memory slots, comprising:
at least one memory substrate, wherein each of the memory substrates comprises a plurality of memory components and a connection interface, and the connection interface is detachably inserted into the corresponding memory slot;
at least one screen disposed on the at least one memory substrate; and
at least one heat dissipation cover disposed on the at least one memory substrate and thermally coupled to the memory components, wherein the at least one heat dissipation cover comprises at least one top surface, the at least one screen is disposed on the at least one top surface of the at least one heat dissipation cover such that the at least one screen is not covered by the at least one heat dissipation cover, the screen is totally exposed, and the at least one screen is thermally coupled to the at least one heat dissipation cover;
at least one power conversion module disposed on the at least one memory substrate and electrically connected to the connection interface or disposed on the motherboard and electrically connected to the at least one of the memory slots; and
at least one screen control module disposed on the at least one memory substrate and electrically connected to the connection interface and the at least one power conversion module or disposed on the motherboard and electrically connected to the at least one of the memory slots and the at least one power conversion module, wherein
when the at least one memory module with the screen is inserted into the at least one of the memory slots, the at least one screen is electrically connected to the at least one power conversion module and the at least one screen control module to receive a voltage output by the at least one power conversion module and a display signal output by the at least one screen control module, the screen is used to display text messages and images, the connection interface comprises serial data and serial clock, and the screen control module is electrically connected to the serial data and serial clock of the connection interface.

6. The motherboard module of claim 5, wherein the at least one power conversion module and the at least one screen control module are electrically connected to a plurality of empty pins of the connection interface of the at least one memory substrate.

7. The motherboard module of claim 5, wherein each of the at least one memory substrates is provided with the corresponding power conversion module and the corresponding screen control module, each of the at least one memory substrates further comprises a standard height region and an expansion region, the expansion region is disposed adjacent to the standard height region and away from the connection interface, and in each of the memory substrates, the memory components are disposed in the standard height region, and the power conversion module and the screen control module are disposed on the expansion region.

8. The motherboard module of claim 5, wherein the at least one memory module with the screen further comprises:
at least one flexible cable fixed to the at least one memory substrate, wherein the at least one screen is electrically connected to the at least one power conversion module and the at least one screen control module via the at least one flexible cable.

9. The motherboard module of claim 5, wherein the at least one memory module with the screen comprises a plurality of memory modules with the screen, and when the memory modules with the screen are inserted into the memory slots, the screens of the memory modules with the screen are spliced together into a combined screen.

* * * * *